US011309167B2

(12) United States Patent
Watanabe et al.

(10) Patent No.: US 11,309,167 B2
(45) Date of Patent: Apr. 19, 2022

(54) ACTIVE GAS GENERATION APPARATUS AND DEPOSITION PROCESSING APPARATUS

(71) Applicant: Toshiba Mitsubishi-Electric Industrial Systems Corporation, Tokyo (JP)

(72) Inventors: Kensuke Watanabe, Tokyo (JP); Shinichi Nishimura, Tokyo (JP); Ren Arita, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 2 days.

(21) Appl. No.: 17/050,853

(22) PCT Filed: Jun. 25, 2018

(86) PCT No.: PCT/JP2018/023972
§ 371 (c)(1),
(2) Date: Oct. 27, 2020

(87) PCT Pub. No.: WO2020/003344
PCT Pub. Date: Jan. 2, 2020

(65) Prior Publication Data
US 2021/0233748 A1   Jul. 29, 2021

(51) Int. Cl.
*H01J 37/32* (2006.01)
*C23C 16/452* (2006.01)
(Continued)

(52) U.S. Cl.
CPC ...... *H01J 37/32568* (2013.01); *C23C 16/452* (2013.01); *C23C 16/455* (2013.01);
(Continued)

(58) Field of Classification Search
CPC .......... H01J 37/32568; H01J 37/32348; H01J 37/3244; H01J 2237/332; H01J 37/32082;
(Continued)

(56) References Cited

U.S. PATENT DOCUMENTS 5,580,385 A * 12/1996 Paranjpe ............... H01J 37/321
118/723 I
5,846,883 A * 12/1998 Moslehi ................ H01J 37/321
438/711
(Continued)

FOREIGN PATENT DOCUMENTS

JP        2537304 B2    9/1996
JP     2010-503962 A   2/2010
(Continued)

OTHER PUBLICATIONS

International Search Report and Written Opinion dated Sep. 4, 2018 for PCT/JP2018/023972 filed on Jun. 25, 2018, 9 pages including English Translation of the International Search Report.
(Continued)

*Primary Examiner* — Rudy Zervigon
(74) *Attorney, Agent, or Firm* — Xsensus LLP

(57) ABSTRACT

In the present invention, a gas passing groove, a high-voltage electrode groove and a ground electrode groove formed in an electrode unit base are each spiral in plan view. A high-voltage electrode is embedded in the high-voltage electrode grove, and a ground electrode is embedded in the ground electrode groove. The high-voltage electrode and the ground electrode are arranged on sides of opposite side surfaces of the gas passing groove in the electrode unit base to oppose each other with a portion of the electrode unit base and the gas passing groove therebetween, and are spiral in plan view along with the gas passing groove.

11 Claims, 15 Drawing Sheets

(51) Int. Cl.
*C23C 16/455* (2006.01)
*C23C 16/50* (2006.01)

(52) U.S. Cl.
CPC .......... *C23C 16/50* (2013.01); *H01J 37/3244* (2013.01); *H01J 37/32348* (2013.01); *H01J 2237/332* (2013.01)

(58) Field of Classification Search
CPC ............. H01J 37/32541; C23C 16/452; C23C 16/455; C23C 16/50; C23C 16/45565; C23C 16/513; C23C 16/505; H05H 1/24
USPC ....... 118/723, 1, 723 E; 156/345.48, 345.49, 156/345.43, 345.44, 345.45, 345.46
See application file for complete search history.

(56) References Cited

U.S. PATENT DOCUMENTS

| | | | | |
|---|---|---|---|---|
| 6,203,620 | B1* | 3/2001 | Moslehi | H01J 37/321 |
| | | | | 118/723 R |
| 6,209,480 | B1* | 4/2001 | Moslehi | H01J 37/321 |
| | | | | 118/723 I |
| RE39,020 | E* | 3/2006 | Hama | C23C 16/45563 |
| | | | | 156/345.48 |
| 9,157,152 | B2* | 10/2015 | Faguet | C23C 16/452 |
| 9,279,185 | B2* | 3/2016 | Li | C23C 16/45563 |
| 10,167,553 | B2* | 1/2019 | Rasheed | C23C 16/455 |
| 10,519,546 | B2* | 12/2019 | Jallepally | C23C 16/455 |
| 11,186,910 | B2* | 11/2021 | Mustafa | C23C 16/45565 |
| 2001/0047760 | A1* | 12/2001 | Moslehi | H01J 37/321 |
| | | | | 118/723 I |
| 2008/0124254 | A1* | 5/2008 | Choi | H01J 37/32091 |
| | | | | 422/186.29 |
| 2010/0192542 | A1 | 8/2010 | Min et al. | |

FOREIGN PATENT DOCUMENTS

| | | |
|---|---|---|
| JP | 2011-11183 A | 1/2011 |
| JP | 5328685 B2 | 10/2013 |
| JP | 2017-91708 A | 5/2017 |
| JP | 2017-91709 A | 5/2017 |
| WO | 2008/032934 A1 | 3/2008 |

OTHER PUBLICATIONS

Office Action dated Nov. 19, 2020, in corresponding Taiwanese patent Application No. 108101018, 16 pages.

Office Action dated Aug. 24, 2021, in corresponding Japanese patent Application No. 2020-526726, 6 pages.

International Preliminary Report on Patentability and the Written Opinion dated Jan. 7, 2021, in corresponding International Patent Application No. PCT/JP2018/023972.

* cited by examiner

F I G. 4
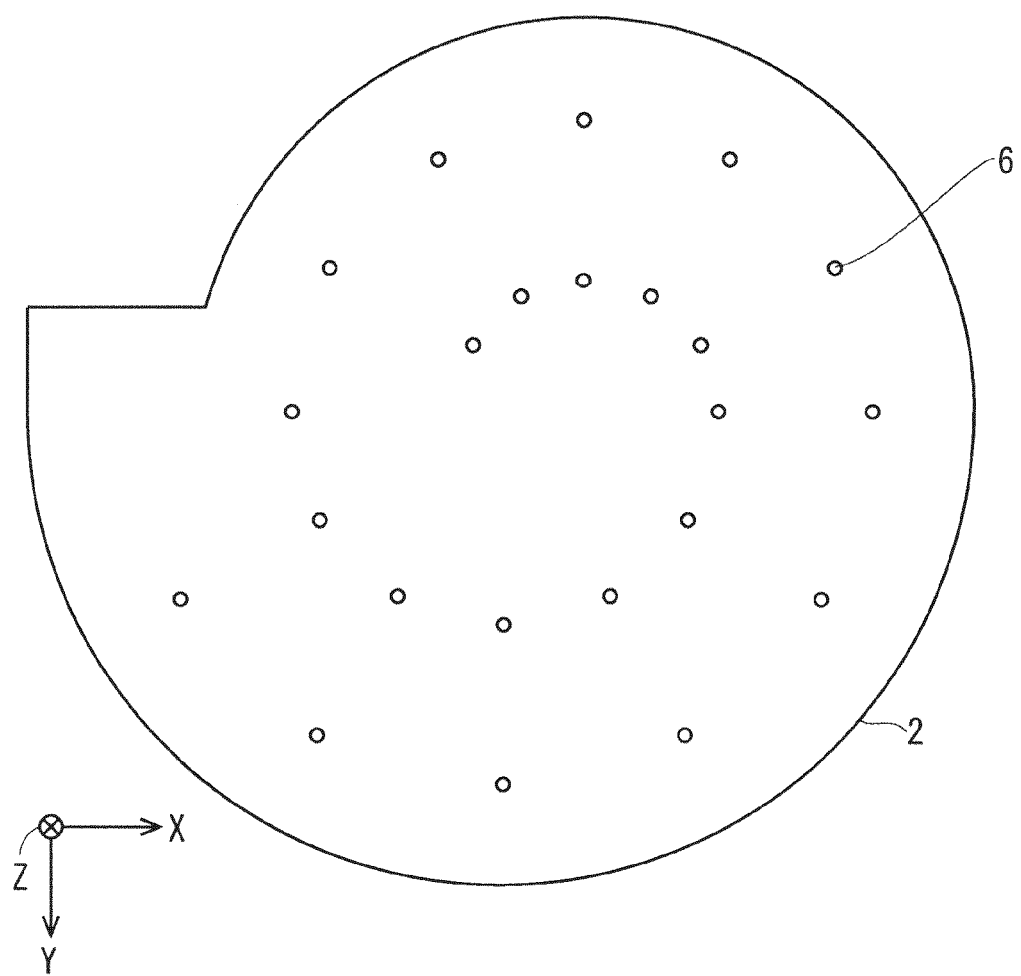

ACTIVE GAS GENERATION APPARATUS AND DEPOSITION PROCESSING APPARATUS

CROSS-REFERENCE TO RELATED APPLICATION

The present application is based on PCT filing PCT/JP2018/023972, filed Jun. 25, 2018, the entire contents of which are incorporated herein by reference.

TECHNICAL FIELD

The present invention relates to active gas generation apparatuses having parallel plate electrode-type electrode structures for use in semiconductor deposition apparatuses and utilizing dielectric barrier discharges.

BACKGROUND ART

An active gas generation apparatus having a parallel plate electrode-type electrode structure and utilizing a dielectric barrier discharge is installed, for example, above a workpiece, such as a wafer. In this case, it is necessary to uniformly spray active gas onto the workpiece as a whole, and thus a shower plate for uniform gas spraying is typically placed between the active gas generation apparatus and the workpiece.

An active gas passing region in the shower plate, however, is a non-discharge space uninvolved in the dielectric barrier discharge, and thus the active gas is deactivated in a time period during which the active gas passes through the active gas passing region in the shower plate. In a case where the active gas generation apparatus generates extremely short-lived active gas, such as a nitrogen radical, deactivation of the radical is significantly accelerated during passing through the shower plate.

As described above, use of the shower plate for the active gas generation apparatus is not desirable as it promotes a phenomenon of deactivation of the active gas.

One example of a conventional active gas generation apparatus not using the shower plate is an atmospheric plasma reactor disclosed in Patent Document 1.

First conventional technology disclosed in Patent Document 1 uses an electrode structure in which plate-like electrodes are vertically arranged to oppose each other, and active gas generated by a discharge between the electrodes is sprayed onto a substrate. In the first conventional technology, a plurality of electrode structures are arranged to handle processing performed on a large-area substrate.

As described above, in the first conventional technology, handling according to the area of the substrate is easily achieved by increasing the number of electrode structures to use a plurality of electrode structures.

Another example of the active gas generation apparatus not using the shower plate is a plasma processing apparatus disclosed in Patent Document 2.

In second conventional technology disclosed in Patent Document 2, one of plate-like electrodes horizontally arranged to oppose each other has a plurality of gas ejection ports to eliminate the need for the shower plate and to enable processing performed on a large substrate.

A first basic configuration is disclosed in a paragraph [0022] and FIGS. 1 and 2 of Patent Document 2. A specific configuration is as described below. Numbers in parentheses are reference signs used in Patent Document 2.

The first basic configuration uses a structure in which a conductive layer (12) is formed on the surface of a high-voltage electrode (8) not having conductivity, and a grounded metal plate (2) is brought into contact with a ground electrode (7) located below the high-voltage electrode (8) and not having conductivity.

A second basic configuration is disclosed in a paragraph [0063] and FIG. 9 of Patent Document 2. A specific configuration is as described below. Numbers in parentheses are reference signs used in Patent Document 2.

The second basic configuration uses, in addition to the first basic configuration, a structure in which a ground conductive layer (41) is buried in the ground electrode (7).

PRIOR ART DOCUMENTS

Patent Documents

Patent Document 1: Japanese Patent No. 2537304
Patent Document 2: Japanese Patent No. 5328685

SUMMARY

Problem to be Solved by the Invention

In the first conventional technology disclosed in Patent Document 1, the plurality of electrode structures are used to achieve an apparatus capable of handling a workpiece having a relatively large area.

Use of the plurality of electrode structures in the first conventional technology, however, requires a high-voltage electrode and a ground electrode to be provided for each of the plurality of electrode structures, and thus complicates an apparatus structure. Furthermore, in the first conventional technology, it is required to sufficiently increase a vertical size of formation of the high-voltage electrode and the ground electrode constituting each of the electrode structures to increase the concentration of the active gas as source gas vertically passes, and this naturally increases the height of the apparatus, and leads to an increase in size of the apparatus.

As described above, the first conventional technology disclosed in Patent Document 1 has a problem in that the apparatus structure is complicated and the size of the apparatus is increased.

The second conventional technology disclosed in Patent Document 2 will be considered next. Numbers in parentheses are reference signs used in Patent Document 2.

In the above-mentioned first basic configuration, electric field strength on the surface of the end of the conductive layer (12) and the like extremely increases to cause electrical breakdown in a gas layer of a discharge part (3), and an abnormal discharge is thereby generated in the conductive layer (12), which is metal, to generate particles and a metal vapor in the discharge part (3). That is to say, substances vaporized from the conductive layer (12), a chamber (1), or the partition plate (2) with the abnormal discharge in the conductive layer (12) become sources of contamination.

As a surface layer of the conductive layer (12) leads to a discharge site (space (9)) between electrodes, molecules vaporized from the conductive layer (12) can enter into the active gas, and contaminate a substrate (15) in the process of transporting the gas to the discharge site.

As described above, the first basic configuration in the second conventional technology has a problem in that the particles and the metal vapor are generated in the discharge part (3), and can contaminate the substrate (15).

To surely prevent the above-mentioned possibility of contamination of the substrate (15), it is necessary to leave a sufficient insulation distance in the discharge part (3). An increase in insulation distance, however, naturally leads to an increase in size of an apparatus configuration, and is thus not desirable.

On the other hand, in the above-mentioned second basic configuration in Patent Document 2, the conductive layer (12) on the high-voltage electrode (8) is exposed to the surface of the electrode as in the first basic configuration. It is theoretically possible not to expose the conductive layer on each of a high-voltage side and a ground side by taking similar measures against the high-voltage electrode to those taken against the ground electrode.

FIG. 15 is a sectional view illustrating a sectional structure of the second basic configuration in the second conventional technology. In FIG. 15, a space 109 corresponds to the space (9), a first electrode 107 corresponds to the ground electrode (7), a pore 110 corresponds to a pore (10), a ground conductive layer 141 corresponds to the ground conductive layer (41), and a ground gap 142 corresponds to a ground gap (42).

As illustrated in FIG. 15, an opening region H141 of the ground conductive layer 141 includes the pore 110 and is formed to have a wider shape than the pore 110, and thus there is the ground gap 142 between an electrode unit 100 and the ground conductive layer 141. The ground conductive layer 141 is not formed in the ground gap 142.

A region above the ground gap 142 in the space 109 to be the discharge site between the electrodes is thus a non-discharge space, and the active gas is only deactivated when the gas passes through the non-discharge space to reduce the concentration of the active gas.

A modification in which the ground conductive layer 141 is improved to be free of the ground gap 142 (the pore 110 and an opening region of the opening region H141 of a main pole part have the same size) will be considered next.

FIG. 16 is a sectional view illustrating a sectional structure of the modification of the second basic configuration in the second conventional technology. A region illustrated in FIG. 16 corresponds to a focused region R7 and a region near the focused region R7 in FIG. 15 illustrated to be enlarged.

In the modification of the second basic configuration, the ground conductive layer 141 is exposed to the pore 110 when the pore 110 is observed in cross section. Conductive layer components of the ground conductive layer 141 are thus externally released as contaminants when electrical breakdown occurs in the pore 110 near the exposed portion of the ground conductive layer 141.

As described above, the second basic configuration in the second conventional technology (FIG. 15) has the problem in that the concentration of the active gas is reduced, and the modification of the second basic configuration (FIG. 16) has the problem in that the contaminants are generated.

It is an object of the present invention to provide an active gas generation apparatus solving problems as described above, having a simplified and size-reduced apparatus configuration, and capable of suppressing a phenomenon of deactivation of active gas.

Means to Solve the Problem

An active gas generation apparatus according to the present invention is an active gas generation apparatus generating active gas by activating source gas supplied to a discharge space in which a dielectric barrier discharge is generated, and including: an electrode unit including a first electrode and a second electrode; and an AC power source supplying an AC voltage to the electrode unit, wherein the electrode unit includes: an electrode body part made of a dielectric; the first electrode and the second electrode located within the electrode body part, and each having conductivity; a gas inlet located in the electrode body part, and receiving the source gas externally supplied; and a gas internal flow path (24) located within the electrode body part, and allowing the source gas having entered through the gas inlet to pass therethrough, the gas internal flow path being spiral in plan view, the first electrode and the second electrode are arranged on sides of opposite side surfaces of the gas internal flow path to oppose each other with a portion of the electrode body part and the gas internal flow path therebetween, and are spiral in plan view along with the gas internal flow path, a region in the gas internal flow path between the first electrode and the second electrode being the discharge space, the dielectric barrier discharge being generated in the discharge space upon application of the AC voltage from the AC power source, the electrode unit further includes a plurality of gas ejection ports located below the discharge space to communicate with the gas internal flow path, and the active gas generated by activating the source gas supplied to the discharge space is jetted through the plurality of gas ejection ports.

Effects of the Invention

The electrode unit of the active gas generation apparatus as the invention of the present application in claim 1 includes the gas internal flow path being spiral in plan view and the plurality of gas ejection ports located below the discharge space to communicate with the gas internal flow path.

The active gas generation apparatus as the invention of the present application in claim 1 thus has an effect of effectively suppressing a phenomenon of deactivation of the active gas because a non-discharge space uninvolved in the dielectric barrier discharge is not formed between the plurality of gas ejection ports and the discharge space.

Furthermore, the electrode unit can be obtained to have a relatively simple configuration in which the gas inlet, the plurality of gas ejection ports, the first electrode, the second electrode, and the gas internal flow path are provided to the electrode body part, and thus an apparatus configuration of the active gas generation apparatus can be simplified.

In addition, in the invention of the present application in claim 1, the gas internal flow path is spiral in plan view, and thus the active gas can be jetted through the plurality of gas ejection ports with a gas concentration being saturated without increasing the area of the electrode unit itself, so that the size of the apparatus can be reduced.

The objects, features, aspects, and advantages of the present invention will become more apparent from the following detailed description and the accompanying drawings.

BRIEF DESCRIPTION OF DRAWINGS

FIG. 4 is a bottom plan view illustrating the planar structure of the electrode unit base shown in FIG. 1.

DESCRIPTION OF EMBODIMENTS

Embodiment 1

An active gas generation apparatus 10 in Embodiment 1 houses therein an electrode unit 100 for generating a dielectric barrier discharge.

Figure 1:
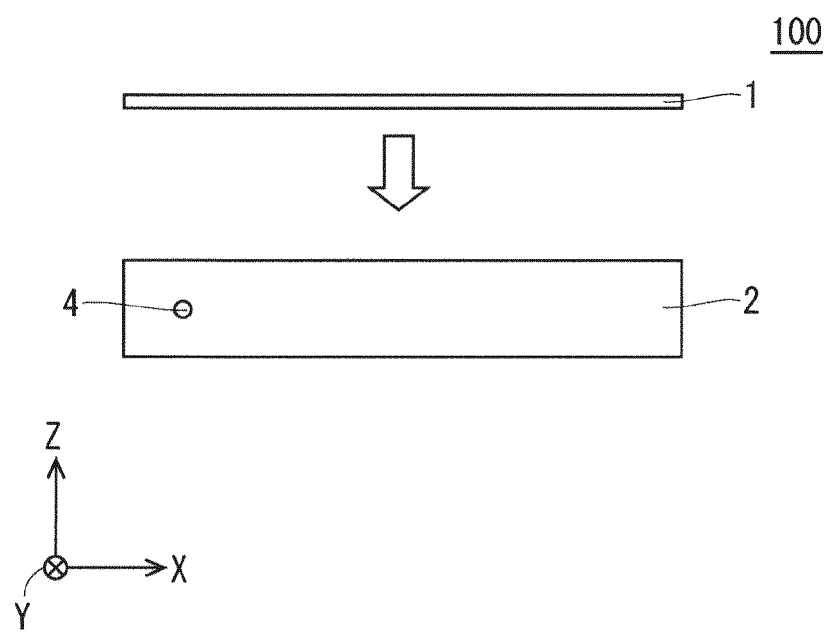
FIG. 1 shows a schematic configuration of an electrode unit for use in an active gas generation apparatus in Embodiment 1.

FIG. 1 shows a schematic configuration of the electrode unit 100 for use in the active gas generation apparatus 10 in Embodiment 1. An XYZ Cartesian coordinate system is shown in FIG. 1. The XYZ Cartesian coordinate system is shown in each of FIGS. 2 to 14 described below as in FIG. 1.

As illustrated in FIG. 1, the electrode unit 100 includes, as main components, an electrode unit lid 1 and an electrode unit base 2 each made of a dielectric. The electrode unit lid 1 is located on an upper surface of the electrode unit base 2, and the electrode unit base 2 has, in a side surface thereof, a gas inlet 4 for supply of source gas. A combined structure of the electrode unit lid 1 and the electrode unit base 2 is an electrode body part.

Figure 2:
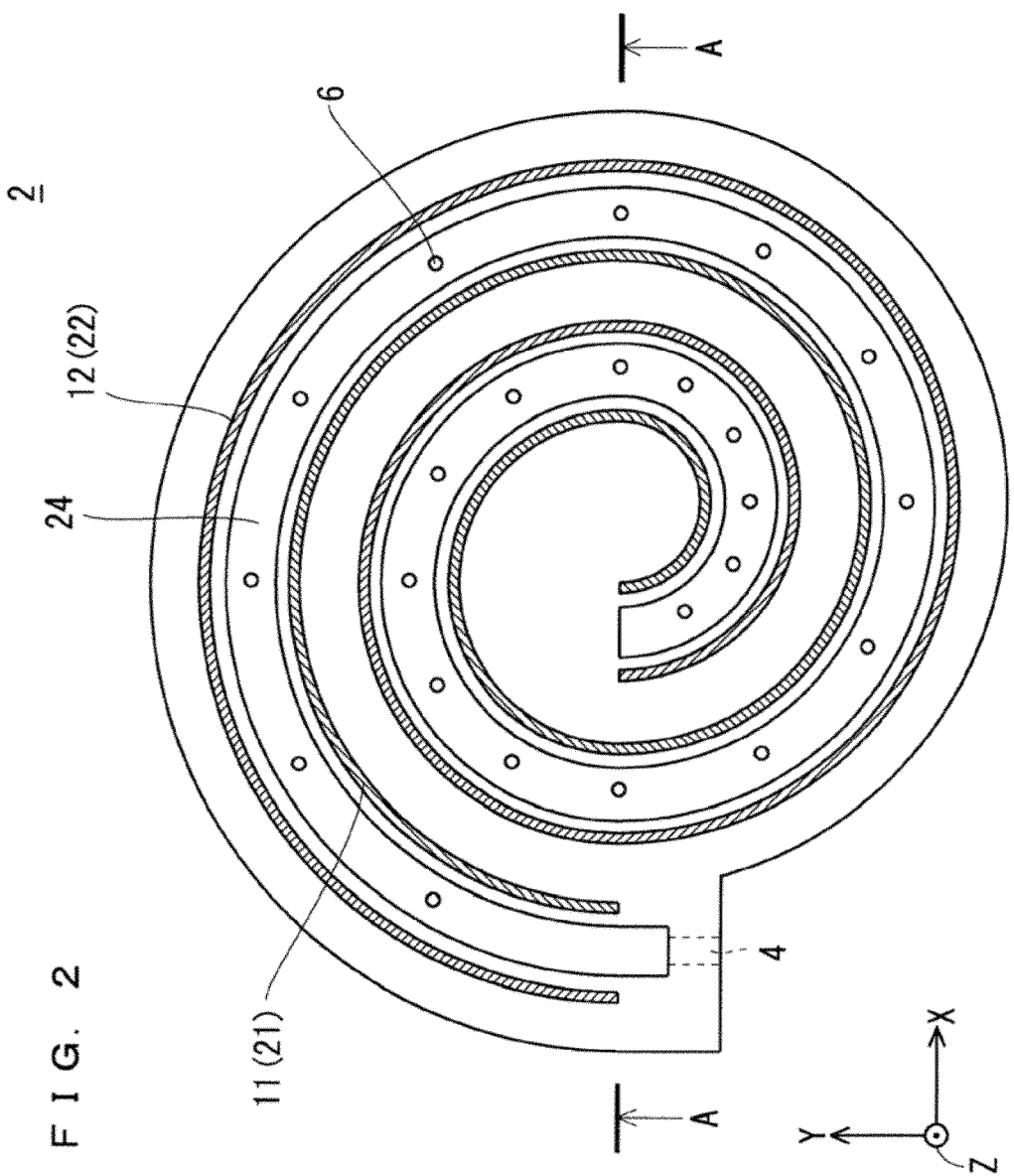
FIG. 2 is a top plan view illustrating a planar structure of an electrode unit base shown in FIG. 1.

FIG. 2 is a top plan view illustrating a planar structure of the electrode unit base 2. As illustrated in FIG. 2, a gas passing groove 24, a high-voltage electrode groove 21, and a ground electrode groove 22 are formed in the electrode unit base 2 from the front surface of the electrode unit base 2. The gas passing groove 24, the high-voltage electrode groove 21, and the ground electrode groove 22 are each spiral in plan view.

Figure 3:
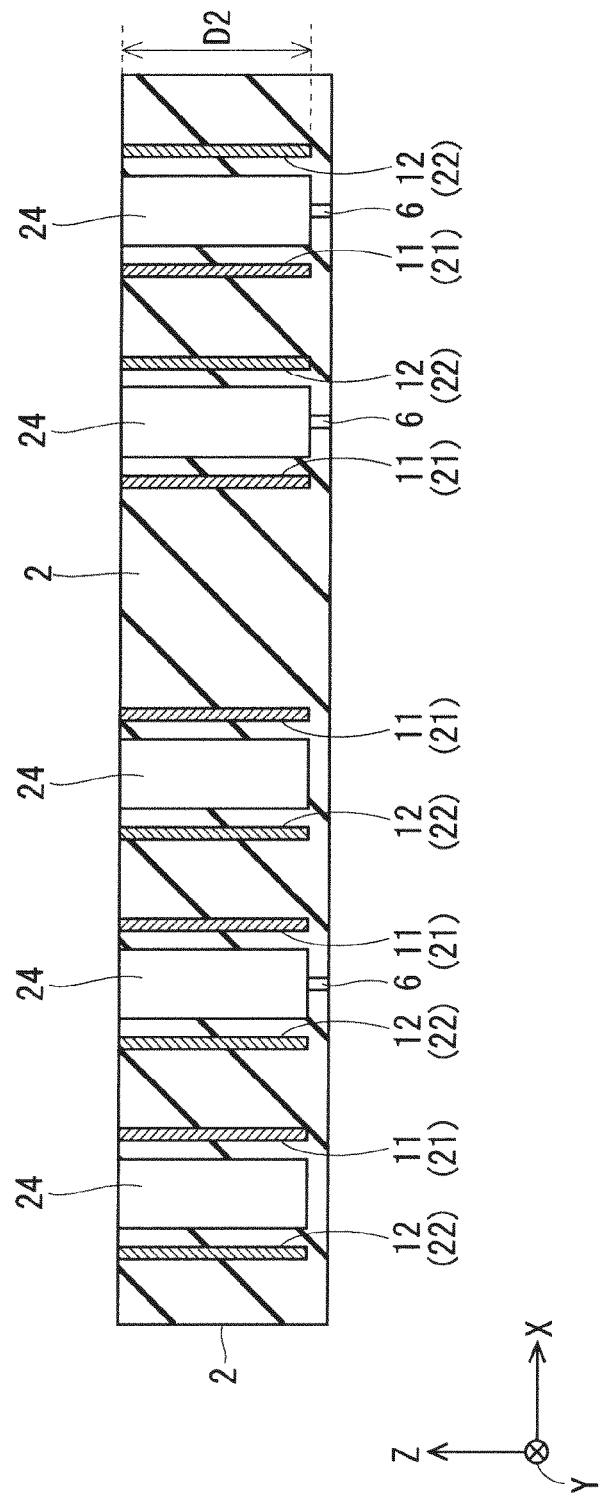
FIG. 3 is a sectional view illustrating a sectional structure of the electrode unit base shown in FIG. 1.

FIG. 3 is a sectional view illustrating a sectional structure of the electrode unit base 2. FIG. 3 is taken along the line A-A of FIG. 2.

As illustrated in FIG. 3, the gas passing groove 24, the high-voltage electrode groove 21, and the ground electrode groove 22 are each formed to have a bottom surface located slightly higher than a bottom surface of the electrode unit base 2. The gas passing groove 24, the high-voltage electrode groove 21, and the ground electrode groove 22 are set to have the same formation depth D2 from the front surface.

As described above, the electrode unit base 2 has the high-voltage electrode groove 21 as a first electrode groove and the ground electrode groove 22 as a second electrode groove having the same formation depth from the front surface.

The electrode unit base 2 further has the gas passing groove 24 that is groove-shaped to have the depth D2 (a predetermined formation depth) from the front surface.

The high-voltage electrode groove 21 and the ground electrode groove 22 are arranged on sides of opposite side surfaces of the gas passing groove 24 within the electrode unit base 2 to oppose each other with a portion of the electrode unit base 2 and the gas passing groove 24 therebetween, and are spiral in plan view along with the gas passing groove 24.

A high-voltage electrode 11 as a first electrode is embedded in the high-voltage electrode groove 21, and a ground electrode 12 as a second electrode is embedded in the ground electrode groove 22. In this case, the high-voltage electrode 11 is embedded throughout the high-voltage electrode groove 21 so as not to form a gap in the high-voltage electrode groove 21, and the ground electrode 12 is embedded throughout the ground electrode groove 22 so as not to form a gap in the ground electrode groove 22.

The high-voltage electrode 11 and the ground electrode 12 are thus arranged on the sides of the opposite side surfaces of the gas passing groove 24 within the electrode unit base 2 to oppose each other with the portion of the electrode unit base 2 and the gas passing groove 24 therebetween, and are spiral in plan view along with the gas passing groove 24. A region in the gas passing groove 24 between the high-voltage electrode 11 and the ground electrode 12 is a discharge space.

FIG. 4 is a bottom plan view illustrating the planar structure of the electrode unit base 2.

As illustrated in FIGS. 2 to 4, a plurality of gas ejection ports 6 penetrating a region of the electrode unit base 2 under the bottom surface of the gas passing groove 24 are discretely and selectively arranged. The plurality of gas ejection ports 6 are arranged below the discharge space to lead to the bottom surface of the gas passing groove 24. That is to say, the plurality of gas ejection ports 6 communicate with the gas passing groove 24. The active gas generated in the gas passing groove 24 can thus be externally jetted through the plurality of gas ejection ports 6.

As illustrated in FIGS. 1 and 2, a gas inlet 4 to receive the source gas externally supplied is located in one side surface of the electrode unit base 2, and the gas passing groove 24 is located to communicate with the gas inlet 4. The source gas having entered through the gas inlet 4 thus passes through the gas passing groove 24.

The electrode unit lid 1 and the electrode unit base 2 are each made of the dielectric, such as alumina.

Figure 5:
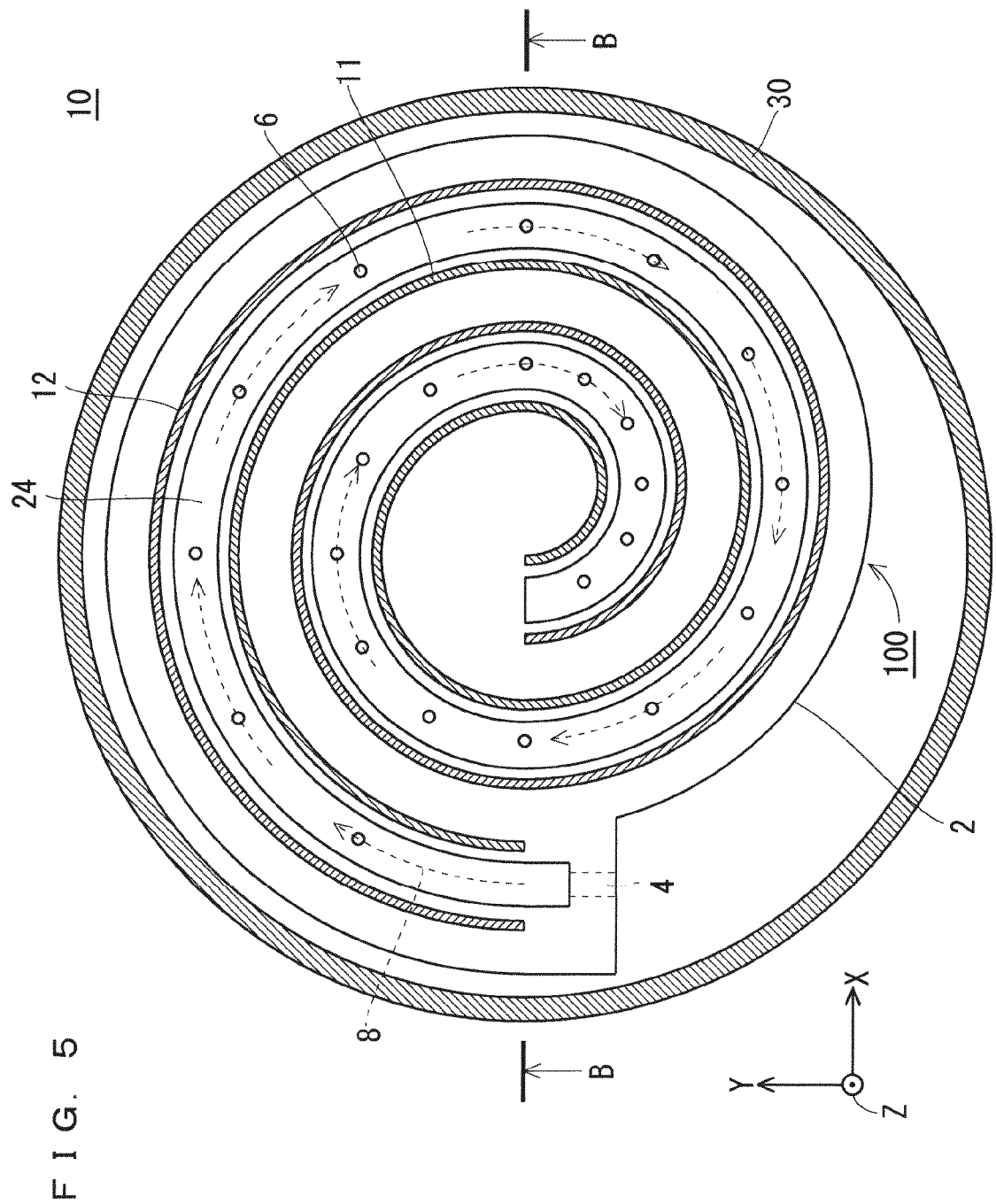
FIG. 5 is a top plan view schematically showing a planar structure of the active gas generation apparatus in Embodiment 1.
Figure 6:
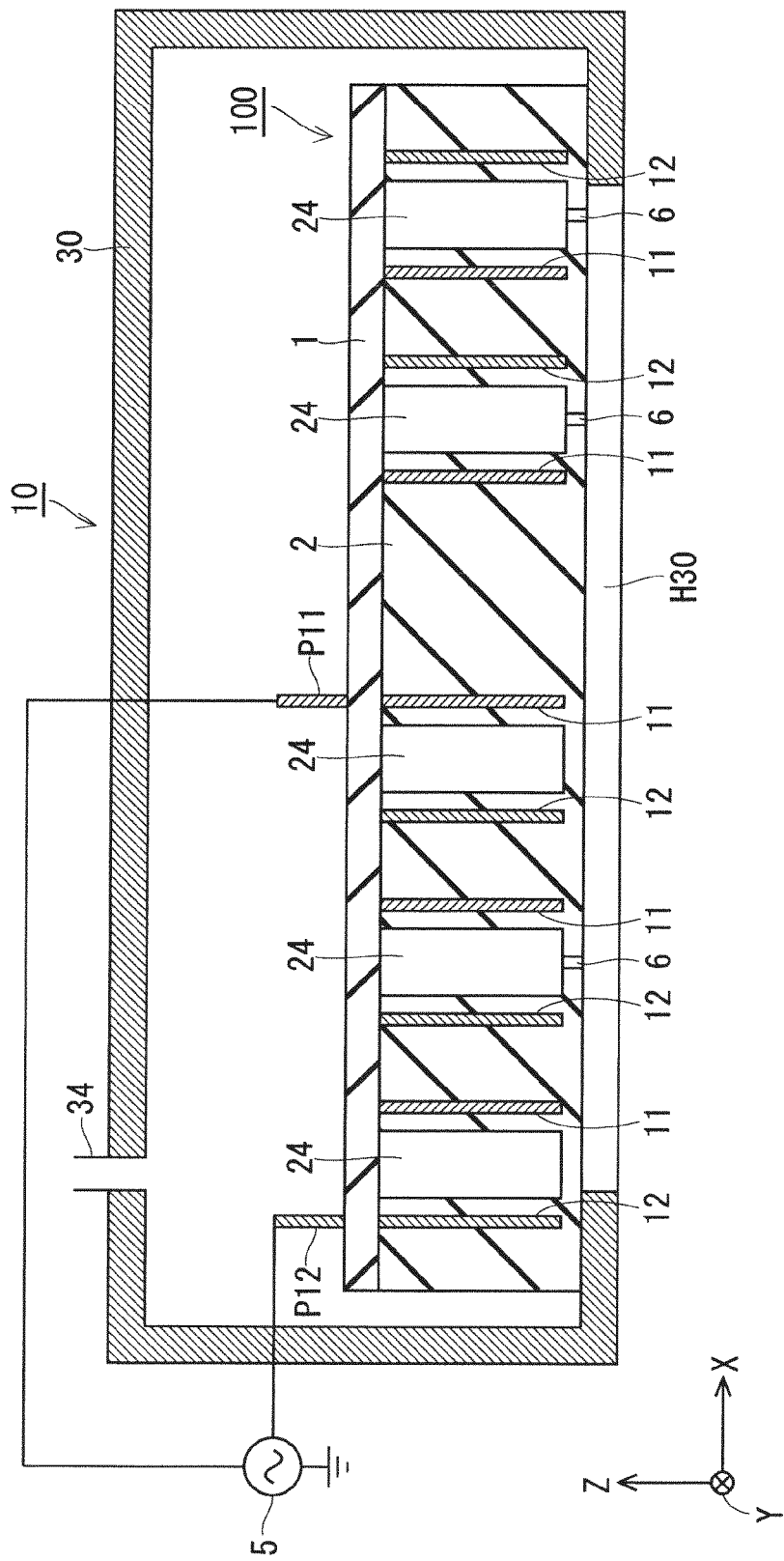
FIG. 6 is a sectional view illustrating a sectional structure of the active gas generation apparatus in Embodiment 1.

FIG. 5 is a top plan view schematically showing a planar structure of the active gas generation apparatus 10 in Embodiment 1. FIG. 6 is a sectional view illustrating a sectional structure of the active gas generation apparatus 10 in Embodiment 1. FIG. 6 is taken along the line B-B of FIG. 5. For illustrative purposes, the electrode unit lid 1 is removed in FIG. 5.

As shown in FIGS. 5 and 6, the electrode unit 100 is housed in an apparatus housing 30. The apparatus housing 30 is made of metal, such as an aluminum alloy, and has, in an upper surface thereof, a gas supply inlet 34 for supply of the source gas.

The electrode unit 100 is mounted on a portion of a bottom surface of the apparatus housing 30, and the apparatus housing 30 has an opening H30 in the center of the bottom surface. The opening H30 is provided to overlap all the plurality of gas ejection ports 6 in plan view.

The electrode unit lid 1 is sealed onto the upper surface of the electrode unit base 2 through a sealing member, such as an O-ring.

Since the electrode unit lid 1 is sealed onto the upper surface of the electrode unit base 2 as described above, the high-voltage electrode 11 and the ground electrode 12 are located within the electrode body part without being exposed from the combined structure of the electrode unit lid 1 and the electrode unit base 2 as the electrode body part.

Since the electrode unit lid 1 is sealed onto the electrode unit base 2, the gas passing groove 24 is a gas internal flow path sealed so as not to expose an upper portion thereof at a stage of completion of the electrode unit 100. In the present description, for illustrative purposes, the "gas passing groove 24" includes that at a stage of the electrode unit base 2 before the electrode unit lid 1 is disposed and that at the stage of completion of the electrode unit 100.

In the active gas generation apparatus 10 having such a configuration, gas having entered into the electrode unit 100 through the gas inlet 4 flows through the gas passing groove 24 formed to be spiral along a gas flow 8 shown by dashed arrows in FIG. 5, and is released through the plurality of gas ejection ports 6 arranged under the bottom surface of the gas passing groove 24.

Figure 7:
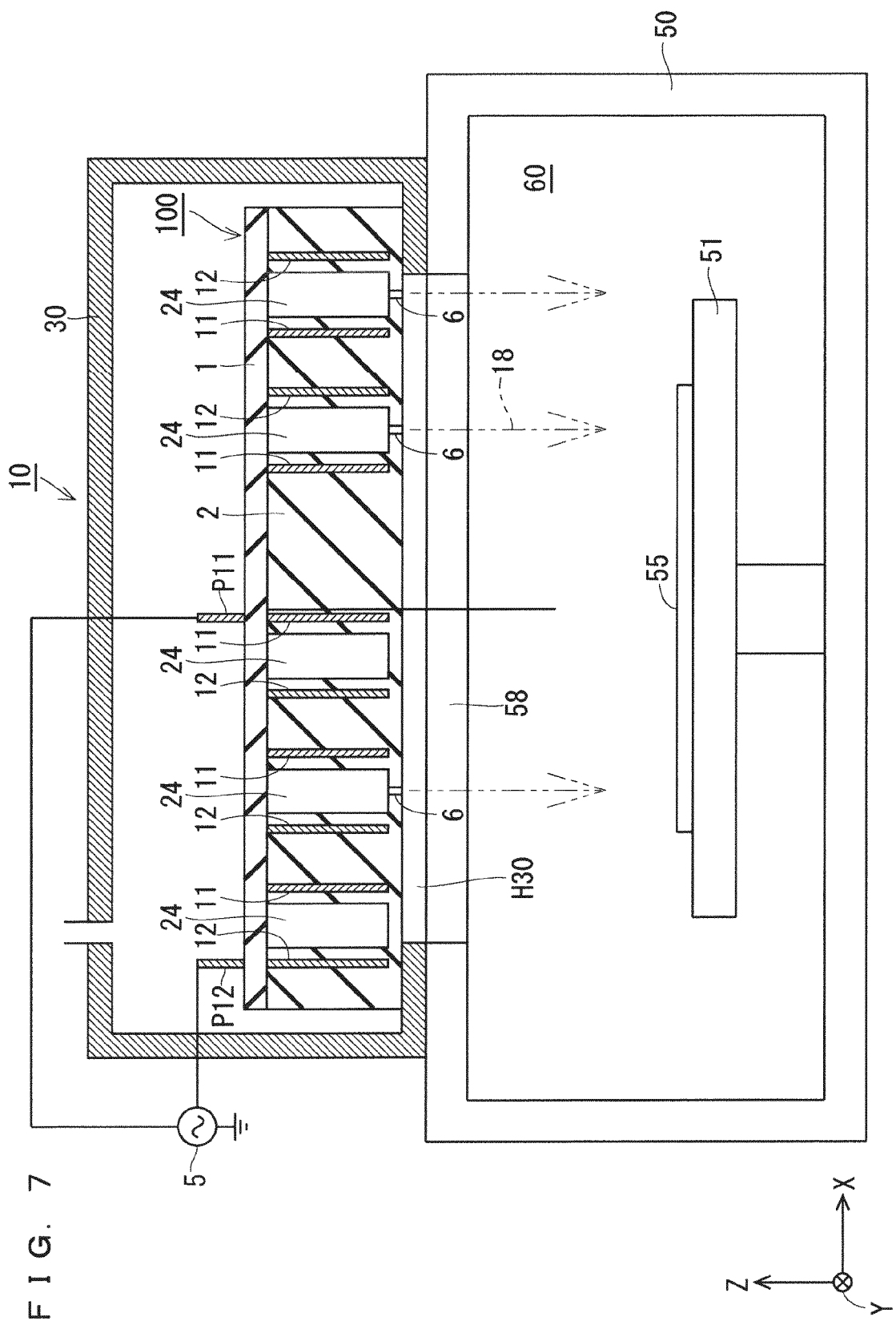
FIG. 7 is a sectional view illustrating a sectional structure of a deposition processing apparatus including the active gas generation apparatus in Embodiment 1.

FIG. 7 is a sectional view illustrating a sectional structure of a deposition processing apparatus including the active gas generation apparatus 10 in Embodiment 1.

As illustrated in FIG. 7, a deposition processing chamber 50 is placed immediately below the active gas generation apparatus 10. That is to say, an external region which is located immediately below the active gas generation apparatus 10 and to which the active gas is jetted through the plurality of gas ejection ports 6 is an apparatus downstream region, and the deposition processing chamber 50 is placed to include the apparatus downstream region.

The deposition processing chamber 50 has an opening 58 in an upper portion thereof, and the opening 58 is provided to coincide with the opening H30 in plan view.

The deposition processing chamber 50 has a deposition processing space 60 therein, and a wafer 55 as a workpiece for deposition is mounted on a mounting table 51 located on a bottom surface thereof.

The active gas jetted through the plurality of gas ejection ports 6 of the active gas generation apparatus 10 is thus supplied to the wafer 55 in the deposition processing space 60 of the deposition processing chamber 50 through the opening H30 and the opening 58. That is to say, the active gas jetted from the active gas generation apparatus 10 is directly supplied to the wafer 55 without passing through the shower plate.

When the deposition processing apparatus performs deposition processing, pressure in the deposition processing space 60 of the deposition processing chamber 50 is set to several kilopascals or less, and pressure in the gas passing groove 24 of the electrode unit 100 is set to several kilopascals to atmospheric pressure (=101.33 kPa).

The plurality of gas ejection ports 6 are each circular to have a minute diameter in plan view. The plurality of gas ejection ports 6 can thus function as an orifice to establish a pressure differential between the interior of the gas passing groove 24 and the interior of the deposition processing space 60 of the deposition processing chamber 50.

That is to say, in the active gas generation apparatus 10 in Embodiment 1, the plurality of gas ejection ports 6 have relatively small dimensions so that the pressure in the gas passing groove 24 is higher than the pressure in the deposition processing space 60 placed to include the above-mentioned apparatus downstream region.

As described above, the plurality of gas ejection ports 6 are formed to have relatively small dimensions to narrow gas flow paths. The active gas thus uniformly fills the gas passing groove 24, and can uniformly be jetted through the plurality of gas ejection ports 6 in accordance with the pressure differential between the gas passing groove 24 and the deposition processing chamber 50.

As described above, the active gas generation apparatus 10 in Embodiment 1 causes the plurality of gas ejection ports 6 to function as the orifice, so that the pressure in the gas passing groove 24 is set to be higher than the pressure in the deposition processing space 60 present in a region including the apparatus downstream region.

This produces an effect of uniformly jetting the active gas through the plurality of gas ejection ports 6 in accordance with the pressure differential between the gas passing groove 24 and the deposition processing space 60 (deposition processing chamber 50).

In the active gas generation apparatus 10, it is desirable to set the pressure in the gas passing groove 24 to 10 kPa to the atmospheric pressure and to set the pressure in the deposition processing space 60 to less than the pressure in the gas passing groove 24.

In the active gas generation apparatus 10, by setting the pressure in the gas passing groove 24 to 10 kPa to the atmospheric pressure (10 kPa or more and the atmospheric pressure or less), pressure in the discharge space formed in the gas passing groove 24 as the gas internal flow path can be set appropriately.

In the deposition processing chamber 50, by setting the pressure in the deposition processing space 60 to less than the pressure in the gas passing groove 24, the active gas is jetted through the plurality of gas ejection ports 6 with the gas passing groove 24 of the active gas generation apparatus 10 being filled with the active gas.

The active gas generation apparatus 10 can thus jet the active gas through the plurality of gas ejection ports 6 with uniform jet velocity.

As a result, the above-mentioned deposition processing apparatus including the active gas generation apparatus 10 in Embodiment 1 and the deposition processing chamber 50 can perform deposition processing with accuracy.

Furthermore, as for the gas inlet 4 located in the side surface of the electrode unit base 2, any special piping connection and the like are not necessary in the active gas generation apparatus 10. The active gas generation apparatus 10 has an extremely simple configuration in which, by simply supplying the gas through the gas inlet 4, the filling gas naturally flows from the gas inlet 4 throughout the gas passing groove 24.

The bottom surface of the electrode unit 100 and the bottom surface of the apparatus housing 30 are sealed to each other using a sealing member, such as an O-ring, so that the gas in the active gas generation apparatus 10 does not have a path to be externally released other than a gas distribution path including the gas inlet 4, the gas passing groove 24, and the plurality of gas ejection ports 6.

As illustrated in FIGS. 2 and 3, the high-voltage electrode groove 21 and the ground electrode groove 22 formed in the electrode unit base 2 each have a substantially smaller formation width (length in the X direction) than the gas passing groove 24.

As a method for forming the high-voltage electrode 11 and the ground electrode 12, a first method of inserting metal foil or a metal plate into the high-voltage electrode groove 21 to form the high-voltage electrode 11, and inserting metal foil or a metal plate into the ground electrode groove 22 to form the ground electrode 12 is considered.

However, a gap is likely to be formed between the grooves 21 and 22 when the metal foil or the metal plate is used, and, if a region having a high electric field strength is generated in the gap, electrical breakdown is easily caused. It is thus desirable to use, in place of the above-mentioned first method, a second method of pouring a metal paste and the like into the high-voltage electrode groove 21 and the ground electrode groove 22 so that the grooves 21 and 22 are completely sealed without any gap to form the high-voltage electrode 11 and the ground electrode 12.

An AC power source 5 as a high-frequency power source is connected to the high-voltage electrode 11 and the ground electrode 12. Specifically, an AC voltage to be a high voltage is applied from the AC power source 5 to the high-voltage electrode 11 through a high-voltage terminal P11, and the ground electrode 12 is set to ground level through a ground terminal P12.

Figure 8:
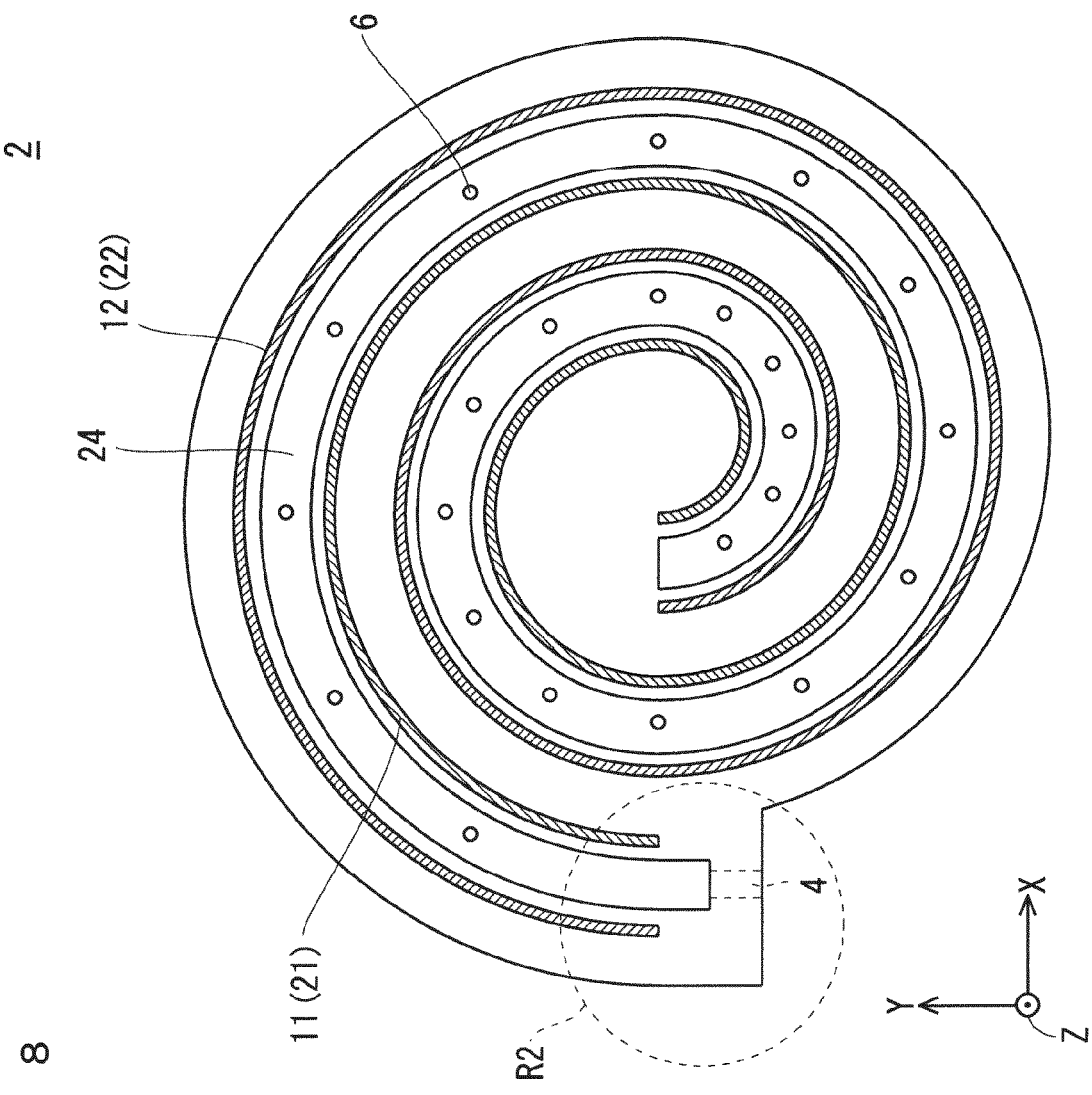
FIG. 8 is a top plan view illustrating the planar structure of the electrode unit base shown in FIG. 1.
Figure 9:
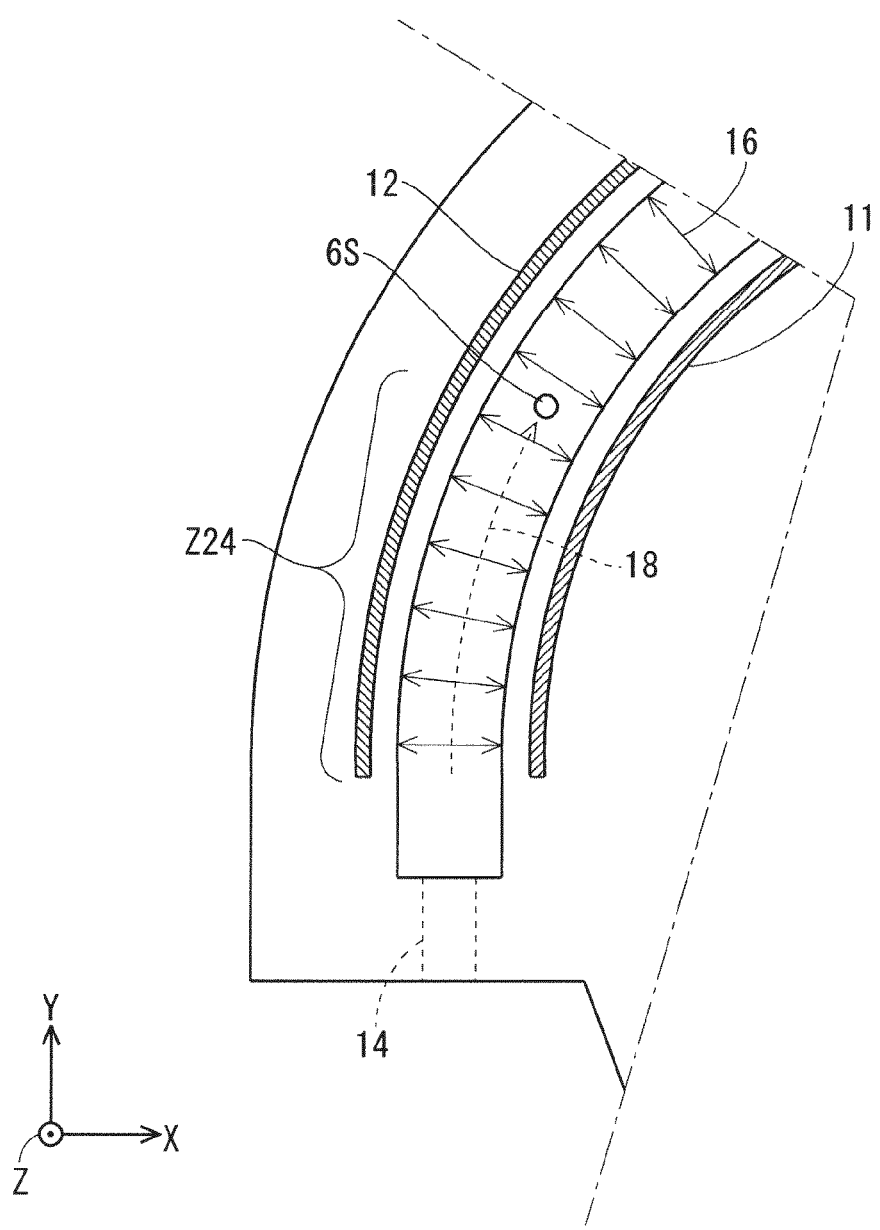
FIG. 9 is an enlarged view of a focused region in FIG. 8.

FIG. 8 is a top plan view illustrating the planar structure of the electrode unit base 2, and FIG. 9 is an enlarged view of a focused region R2 in FIG. 8.

Figure 10:
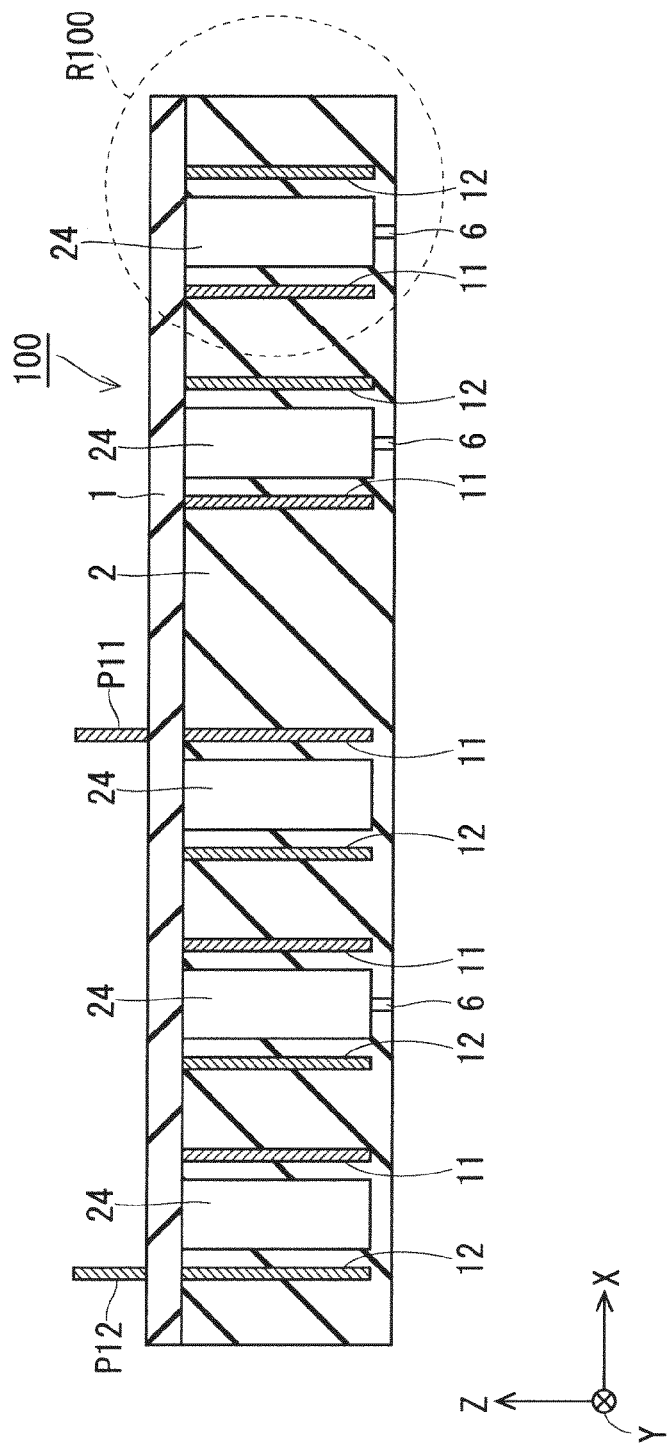
FIG. 10 is a sectional view illustrating a sectional structure of the electrode unit for use in the active gas generation apparatus in Embodiment 1.
Figure 11:
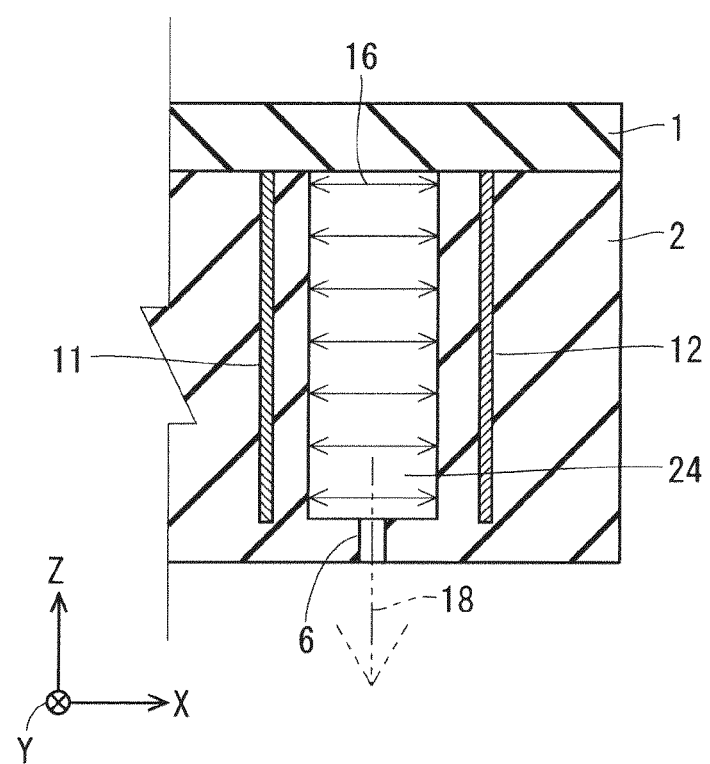
FIG. 11 is an enlarged view of a focused region in FIG. 10.

FIG. 10 is a sectional view illustrating a sectional structure of the electrode unit 100, and FIG. 11 is an enlarged view of a focused region R100 in FIG. 10.

As the electrode unit base 2 itself is made of the dielectric, an AC voltage having a frequency of 10 kHz to 100 kHz and a 0 peak value V0p of 2 kV to 10 kV is applied from the AC power source 5 to generate a dielectric barrier discharge 16 in the discharge space as a region in the gas passing groove 24 sandwiched between the high-voltage electrode 11 and the ground electrode 12.

The source gas having entered through the gas inlet 4 into the gas passing groove 24 within the electrode unit base 2 flows through the spiral gas passing groove 24 toward the center thereof while passing through the discharge space in the gas passing groove 24 to be activated, so that the active gas is generated.

As illustrated in FIG. 7, in the deposition processing apparatus, the active gas generation apparatus 10 is installed immediately above the wafer 55 in the deposition processing space 60 of the deposition processing chamber 50, so that the active gas generated in the electrode unit 100 is jetted through the plurality of gas ejection ports 6 toward the wafer 55.

As described above, the deposition processing apparatus including the active gas generation apparatus 10 in Embodiment 1 includes the deposition processing chamber 50 located in the region including the apparatus downstream region, and having the deposition processing space 60 to directly receive the active gas from the plurality of gas ejection ports 6.

The deposition processing apparatus having the above-mentioned configuration can minimize attenuation of the active gas even if the active gas generated by the active gas generation apparatus 10 is relatively short-lived active gas, to thereby improve a deposition rate in the deposition processing space 60.

Furthermore, as described above, the electrode unit lid 1 and the electrode unit base 2 constituting the electrode body part are each made of the dielectric, such as alumina. The dielectric barrier discharge can thus be generated in the discharge space formed in the gas passing groove 24.

Examples of the dielectric, other than alumina, to be a constituent material of the electrode body part include quartz, silicon nitride, aluminum nitride, and boron nitride. The constituent material of the electrode body part is thus required to be at least one of alumina, quartz, silicon nitride, aluminum nitride, and boron nitride.

Furthermore, use of nitrogen, oxygen, noble gases, hydrogen, fluorines, and the like as the source gas allows for use for various types of processing on the wafer 55.

When the source gas is gas containing at least one of nitrogen, oxygen, fluorine, and hydrogen, effects described below can be produced.

This point will be described in detail below. By using nitrogen and oxygen as the source gas, a nitride film and an oxide film as a dielectric film can be deposited. By using fluorine and chlorine gas as the source gas, activated fluorinated gas and activated chlorine gas can be used as etching gas and washing gas. By using hydrogen and nitrogen as the source gas, surface modification processing can be performed by hydrogenating and nitriding a surface of the workpiece, such as the wafer 55, using activated hydrogen gas and activated nitriding gas.

It is desirable to form a discharge site (the discharge space) to a region as close as possible to the gas ejection ports 6 to be the orifice. This is because, if a non-discharge space uninvolved in the discharge is present on a path between the discharge site and the orifice, the non-discharge space becomes a dead space in which the active gas is only deactivated without being generated.

As a region in the gas passing groove 24 located upstream of the plurality of gas ejection ports 6 is a high pressure region, a deactivation rate of the active gas is particularly high. Thus, only a small non-discharge space present on the path between the discharge site and the orifice leads to significant reduction in concentration of the active gas.

Figure 15:
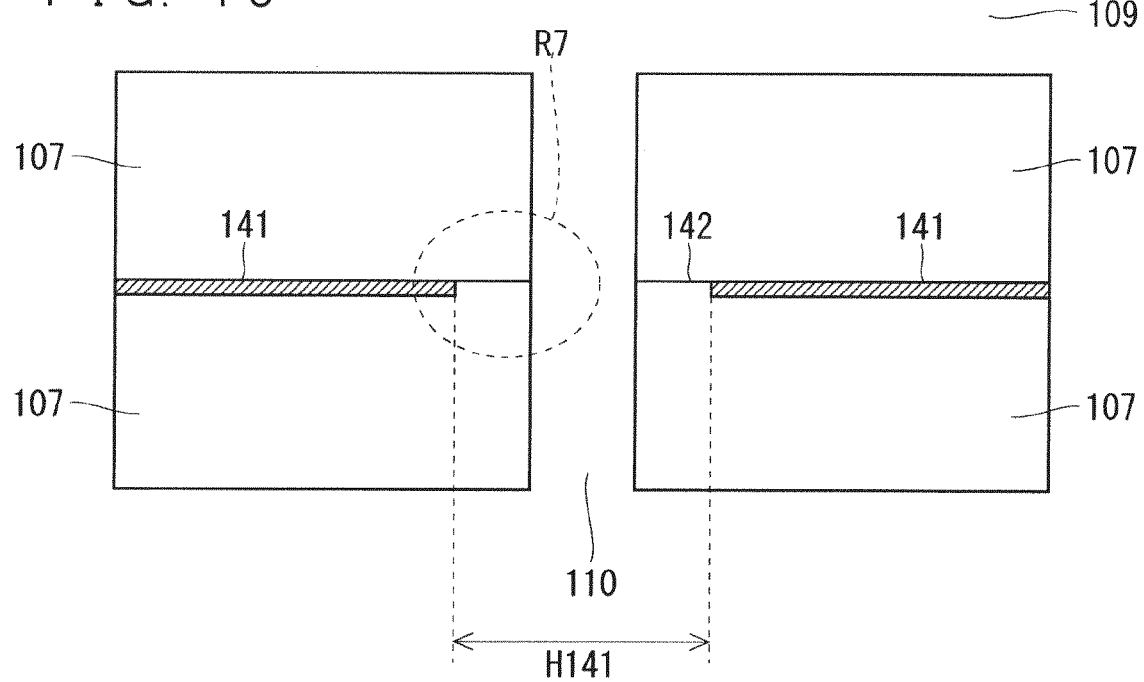
FIG. 15 is a sectional view illustrating a sectional structure of a second basic configuration in second conventional technology.

As described above, the second basic configuration of the second conventional technology disclosed in Patent Document 2 is a configuration in which the non-discharge space is always present in the space 109 present above the ground gap 142 (see FIG. 15), and thus deactivation of the active gas in the non-discharge space is inevitable.

Figure 16:
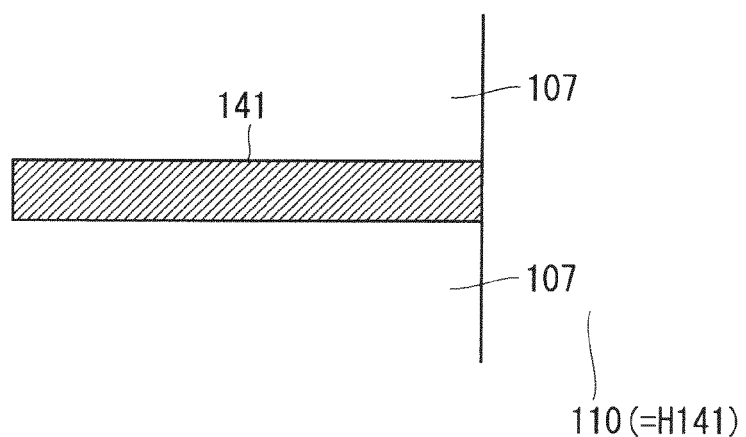
FIG. 16 is a sectional view illustrating a sectional structure of a modification of the second basic configuration in the second conventional technology.

Furthermore, the modification of the second basic configuration causes a problem of entrance of contaminants of the ground conductive layer 141 having an end exposed to the pore 110 (see FIG. 16).

On the other hand, in the active gas generation apparatus 10 in Embodiment 1, the discharge site (discharge space) in which the discharge 16 is generated is formed to an entrance of each of the plurality of gas ejection ports 6 as the orifice, and the non-discharge space to be the dead space is not present in a flow 18 of the active gas on the path from the discharge site to each of the gas ejection ports 6 as illustrated in FIG. 11.

As described above, the electrode unit 100 of the active gas generation apparatus 10 in Embodiment 1 includes the gas passing groove 24 as the gas internal flow path being spiral in plan view and the plurality of gas ejection ports 6 located below the discharge space to communicate with the gas passing groove 24.

The active gas generation apparatus 10 in Embodiment 1 thus produces an effect of effectively suppressing a phenomenon of deactivation of the active gas because the non-discharge space uninvolved in the dielectric barrier discharge is not formed between the plurality of gas ejection ports 6 and the discharge space.

The above-mentioned effect can be produced even in a case where the number of gas ejection ports 6 is one. Therefore, as for the above-mentioned effect, the active gas generation apparatus 10 is only required to have at least one gas ejection port 6.

Furthermore, the electrode unit 100 can be obtained to have a relatively simple configuration in which the gas inlet 4, the plurality of gas ejection ports 6, the high-voltage electrode 11, the ground electrode 12, and the gas passing groove 24 are provided to the electrode body part as the combined structure of the electrode unit lid 1 and the electrode unit base 2, and thus an apparatus configuration of the active gas generation apparatus 10 can be simplified.

In addition, the high-voltage electrode 11 is embedded in the high-voltage electrode groove 21 and the ground electrode 12 is embedded in the ground electrode groove 22 in the electrode unit base 2, and the electrode unit lid 1 is sealed onto the upper surface of the electrode unit base 2.

The high-voltage electrode 11 and the ground electrode 12 of the electrode unit 100 thus do not have a gas flow path leading to the gas passing groove 24 as the gas internal flow path through which the active gas flows and the plurality of gas ejection ports 6, so that a problem of entrance of contaminants into the gas passing groove 24 and the gas ejection ports 6 is basically not caused even if an abnormal discharge is generated in the high-voltage electrode 11 and the ground electrode 12.

As described above, the high-voltage electrode 11 and the ground electrode 12 of the active gas generation apparatus 10 are formed to be completely separated from the discharge space formed in the gas passing groove 24 without being exposed from the electrode body part as the combined structure of the electrode unit lid 1 and the electrode unit base 2.

The active gas generation apparatus 10 in Embodiment 1 can thus surely avoid the problem of entrance of contaminants generated by the abnormal discharge into the discharge space even if the abnormal discharge is generated in the high-voltage electrode 11 or the ground electrode 12.

The source gas having entered into the gas passing groove 24 to be the discharge site alternates between generation and disappearance (deactivation) of the active gas in the gas passing groove 24. By setting time to stay the discharge site equal to or longer than certain time, the active gas has a constant concentration because the amount of generation and the amount of deactivation of the active gas are balanced. The concentration of the active gas is thus saturated.

When deposition processing is performed on the wafer 55, a higher concentration of the active gas is desirable because of processing time and the like, and it is desirable, in term of not only the processing time but also equalization of the concentration of the active gas, that the concentration of the active gas jetted through each of the gas ejection ports 6 be saturated.

In the second conventional technology disclosed in Patent Document 2, the source gas flows from the periphery to the interior of a disk-shaped electrode. In this case, a flow of gas externally released through a pore on an outermost periphery (hereinafter, abbreviated as an "outermost peripheral pore") has the shortest time to stay the discharge site.

To cause the active gas generated by passing through a shortest gas flow path from the periphery of the disk-shaped electrode to the outermost peripheral pore to be a saturated active gas having the saturated concentration of the active gas, it is necessary to set the distance between the outermost peripheral pore and the periphery of the disk-shaped electrode to a saturated gas formation distance. The saturated gas formation distance is a distance necessary for the concentration of the active gas to be saturated.

In this case, a pore cannot be provided in a region extending from the periphery of the disk-shaped electrode by the saturated gas formation distance, and thus it is necessary to dispose a disk-shaped electrode having a substantially larger area than a pore distribution region as a region in which a plurality of pores are provided.

The pore distribution region is determined by the size of the wafer to be the workpiece. In a case where processing is performed on a wafer having a diameter of 300 mm, for example, it is necessary to place the outermost peripheral pore in a region at least having a diameter of approximately 300 mm around the center.

It is thus necessary to dispose the disk-shaped electrode having the periphery at a location radially the above-mentioned saturated gas formation distance away from the outermost peripheral pore in the pore distribution region, and it becomes necessary to dispose the disk-shaped electrode having a much larger area than the wafer to be the workpiece.

On the other hand, in the active gas generation apparatus 10 in Embodiment 1, a single gas passing groove 24 to be the spiral gas internal flow path is sufficient, and thus an increase in formation length of the discharge space in the gas passing groove 24 does not lead to a significant increase in formation area of the electrode unit 100.

As illustrated in FIG. 9, a region extending from a location at which the source gas enters into the discharge space in the gas passing groove 24 to a location at which the source gas reaches a first gas ejection port 6S along the flow 18 of the gas is an active gas concentration increase zone Z24. A spiral distance from the entrance of the discharge space to the first gas ejection port 6S along the flow 18 of the gas in the active gas concentration increase zone Z24 is a first active gas generation distance. The first active gas generation distance is set to satisfy the above-mentioned saturated gas formation distance, so that the active gas can be jetted with the concentration of the gas being saturated through gas ejection ports 6 arranged after the first gas ejection port 6S.

A specific example of the first active gas generation distance in the active gas concentration increase zone Z24 will be described below. A case where the gas passing groove 24 has a formation width (length in the X direction) of 3 mm, and the gas passing groove 24 has a formation height (length in the Z direction) of 50 mm is considered, for example. As the high-voltage electrode groove 21 and the ground electrode groove 22 have the same depth D2 as the gas passing groove 24, the high-voltage electrode 11 and the ground electrode 12 each have a formation height of 50 mm.

In this case, when the pressure in the gas passing groove 24 is set to 30 kPa and a gas flow rate of the source gas supplied through the gas inlet 4 is set to 10 slm, the first active gas generation distance is required to be set to 70 mm or more. That is to say, the above-mentioned saturated gas formation distance is 70 mm.

As described above, in the active gas generation apparatus 10 in Embodiment 1, the gas passing groove 24 to form the discharge space is spiral in plan view, and thus the active gas can be jetted through the plurality of gas ejection ports 6 with the concentration of the gas being saturated without significantly increasing the area of the electrode unit 100 itself.

As a result, in the active gas generation apparatus 10 in Embodiment 1, the formation area of the electrode unit 100 can be reduced to be equivalent to the formation area of the workpiece, such as the wafer 55, and the apparatus can be reduced in size.

The high-voltage electrode 11 and the ground electrode 12 are spiral in plan view, and thus an increase in area of the electrodes can significantly be suppressed compared with that in the second conventional technology disclosed in Patent Document 2.

In the active gas generation apparatus 10 in Embodiment 1, within the electrode unit 100, the high-voltage electrode 11 and the ground electrode 12 are arranged so that the ground electrode 12 is located on the outermost periphery of the electrode unit base 2 in plan view.

A electric field vector directed from the high-voltage electrode 11 to which a high voltage is applied to the periphery of the electrode unit base 2 can always be absorbed by the ground electrode 12 located to be closer to the periphery than the high-voltage electrode 11 is.

The active gas generation apparatus 10 in Embodiment 1 can thus surely suppress the possibility of the abnormal discharge generated in the external apparatus housing 30 by the high-voltage electrode 11.

The active gas generation apparatus 10 in Embodiment 1 thus does not have the possibility of generating particles and a metal vapor in the discharge part due to the abnormal discharge generated in the conductive layer on the high-voltage electrode, and contaminating the workpiece as in the first basic configuration of the second conventional technology. Furthermore, in the active gas generation apparatus 10, there is no need to particularly consider leaving the insulation distance in an internal space of the apparatus housing 30, and thus the apparatus is not increased in size.

The active gas generation apparatus 10 in Embodiment 1 is characterized in that the plurality of gas ejection ports 6 are discretely arranged to be spiral in plan view.

The active gas generation apparatus 10 in Embodiment 1 can thus uniformly jet the active gas even to a relatively large workpiece by jetting the active gas through the plurality of gas ejection ports 6.

Embodiment 2

Figure 12:
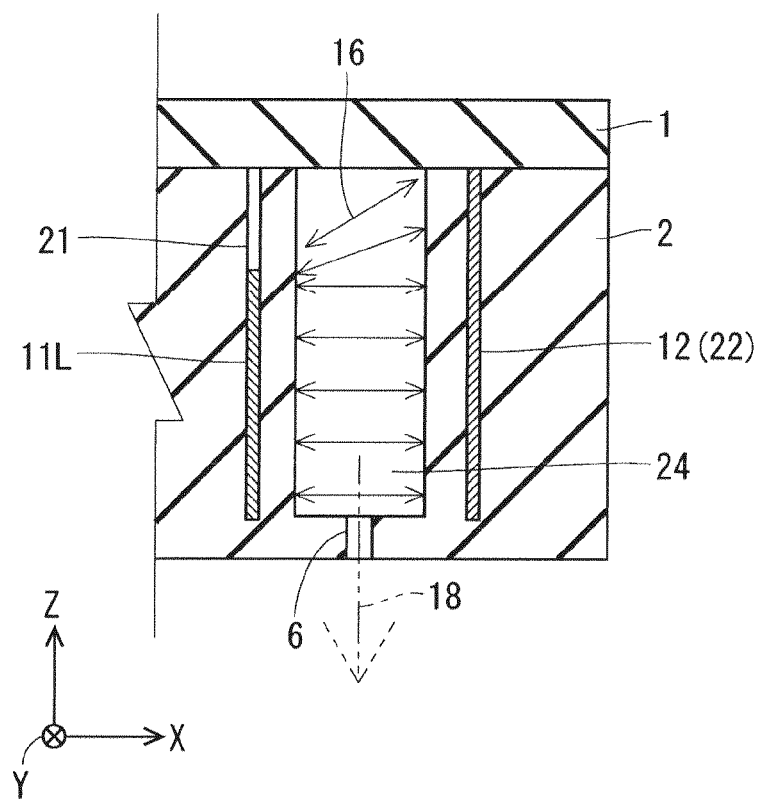
FIG. 12 is an enlarged view of a sectional structure of electrodes of an active gas generation apparatus in Embodiment 2.
Figure 13:
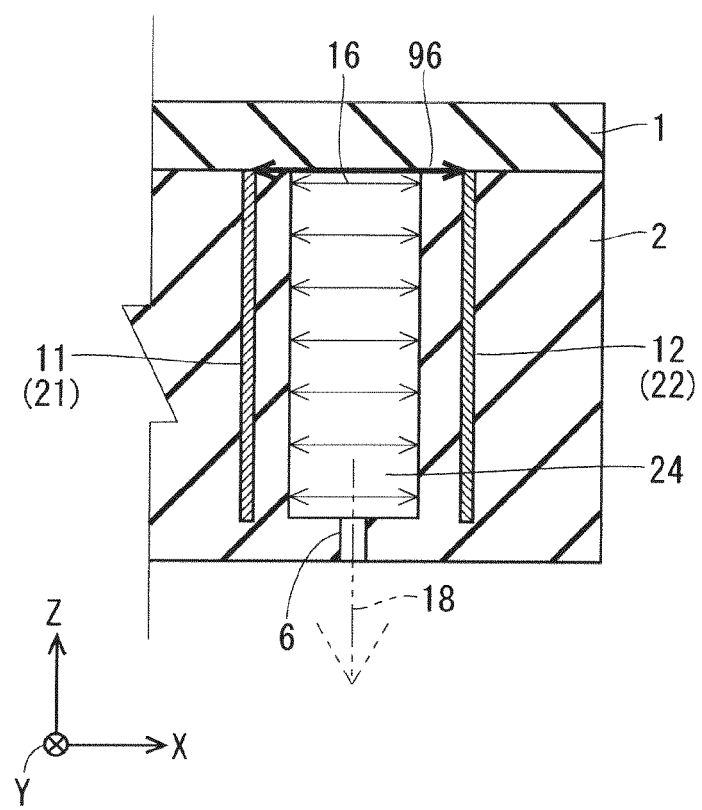
FIG. 13 is an enlarged view of a sectional structure of electrodes of the active gas generation apparatus in Embodiment 1.

FIG. 12 is a sectional view illustrating a sectional structure of the electrodes of an active gas generation apparatus 10 in Embodiment 2. FIG. 13 is a sectional view illustrating a sectional structure of the electrodes of the active gas generation apparatus 10 in Embodiment 1.

As illustrated in FIG. 12, in Embodiment 2, a high-voltage electrode 11L is embedded in a portion of the high-voltage electrode groove 21 so that a space region remains in an upper portion of the high-voltage electrode groove 21. On the other hand, the ground electrode 12 is embedded throughout the ground electrode groove 22 so as not to form a gap in the ground electrode groove 22 as in Embodiment 1.

The active gas generation apparatus 10 in Embodiment 2 is thus characterized in that the high-voltage electrode 11L has a formation height set to be lower than that of the ground electrode 12.

As illustrated in FIG. 13, in Embodiment 1 in which the high-voltage electrode 11 and the ground electrode 12 have the same formation height, an abnormal discharge path 96 can be generated between an uppermost portion of the high-voltage electrode 11 and an uppermost portion of the ground electrode 12. This is because, even when the electrode unit lid 1 is sealed onto the electrode unit base 2, a small gap can be formed between the electrode unit base 2 and the electrode unit lid 1.

In a case where a small gap is formed between the electrode unit lid 1 and the electrode unit base 2 when the abnormal discharge is generated on the abnormal discharge path 96, electrode components of the high-voltage electrode 11 or the ground electrode 12 as contaminants can enter into the gas passing groove 24 as the gas internal flow path through the small gap.

On the other hand, the active gas generation apparatus 10 in Embodiment 2 can effectively suppress generation of the abnormal discharge because the high-voltage electrode 11L has a lower formation height than the ground electrode 12 to set a longer uppermost portion electrode distance between the uppermost portion of the high-voltage electrode 11L and the uppermost portion of the ground electrode 12 than that in Embodiment 1.

The active gas generation apparatus 10 in Embodiment 2 has a similar configuration to that in Embodiment 1 except that the high-voltage electrode 11 is replaced with the high-voltage electrode 11L, and thus produces a similar effect to that in Embodiment 1.

Embodiment 3

Figure 14:
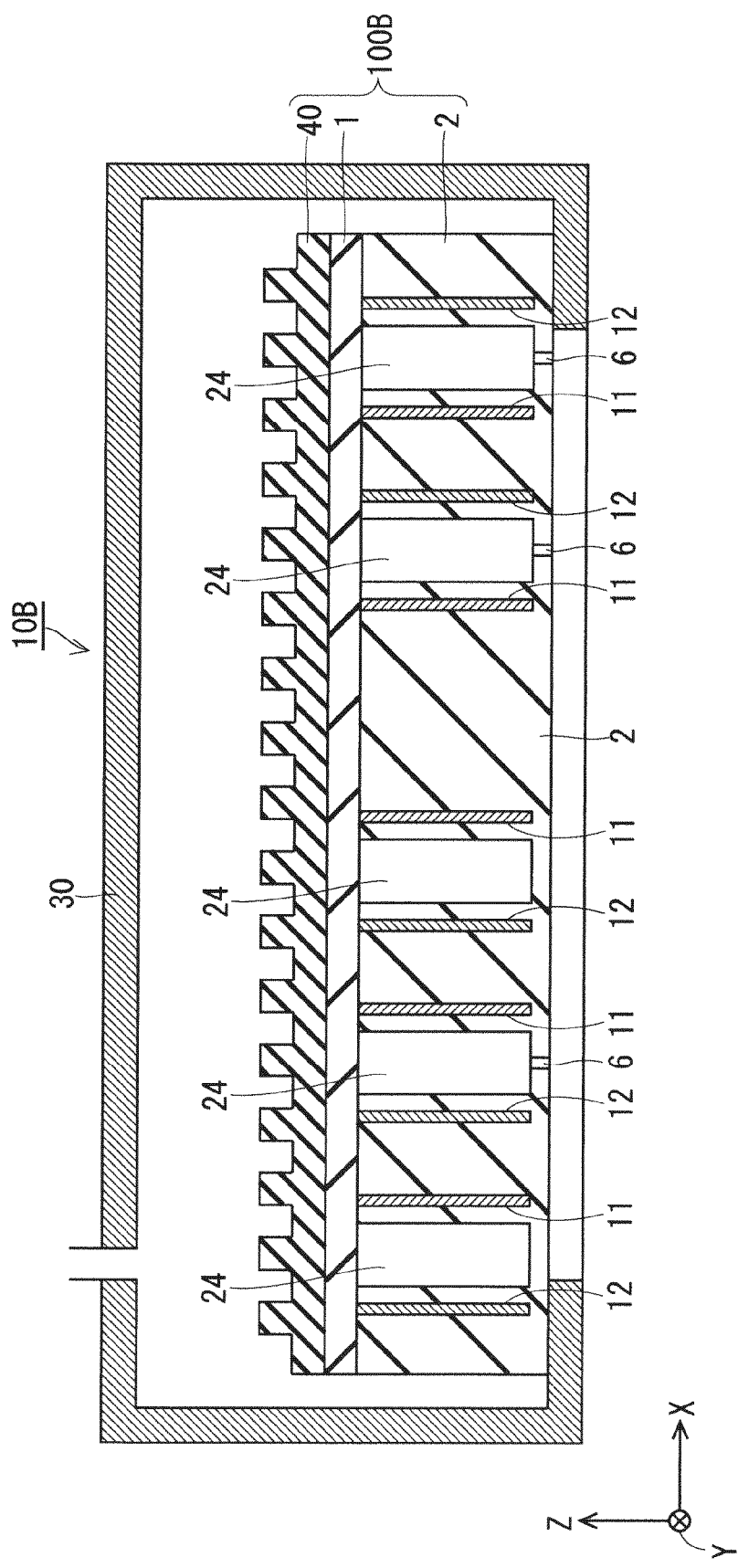
FIG. 14 is a sectional view illustrating a sectional structure of an active gas generation apparatus in Embodiment 3.

FIG. 14 is a sectional view illustrating a sectional structure of an active gas generation apparatus 10B in Embodiment 3.

As illustrated in FIG. 14, the active gas generation apparatus 10B includes an electrode unit 100B. The electrode unit 100B is characterized in that a cooling fin 40 made of a dielectric is disposed on an upper surface of the electrode unit lid 1. The other components are similar to those in Embodiment 1 and thus bear the same reference signs, and description thereof is omitted as appropriate.

The electrode unit generates heat with generation of the dielectric barrier discharge in the discharge space, and can be distorted by a difference in thermal expansion between the apparatus housing made of metal and the electrode body part (the electrode unit lid 1+the electrode unit base 2) made of the dielectric in the active gas generation apparatus.

A cooling method of surrounding the electrode unit with a water-cooling unit made of metal is not suitable for practical use because the abnormal discharge can be generated in the water-cooling unit.

In the active gas generation apparatus 10B in Embodiment 3, the cooling fin 40 made of the dielectric, such as ceramic and glass, is sealed onto the upper surface of the electrode unit lid 1 to remove heat of the electrode unit base 2 in the electrode unit 100B.

The active gas generation apparatus 10B in Embodiment 3 can thus cool the electrode unit 100B using the cooling fin 40 without generating the abnormal discharge.

The active gas generation apparatus 10B in Embodiment 3 has a similar configuration to that in Embodiment 1 except that the cooling fin 40 is added, and thus produces a similar effect to that in Embodiment 1. An effect similar to the effect produced in Embodiment 2 can also be produced by replacing the high-voltage electrode 11 with the high-voltage electrode 11L (see FIG. 12) in Embodiment 2.

While the invention has been described in detail, the foregoing description is in all aspects illustrative and not restrictive. It is therefore understood that numerous modifications not having been described can be devised without departing from the scope of the invention.

The invention claimed is:

1. An active gas generation apparatus generating active gas by activating source gas supplied to a discharge space in which a dielectric barrier discharge is generated, said active gas generation apparatus comprising:
an electrode unit including a first electrode and a second electrode; and
an AC power source supplying an AC voltage to said electrode unit, wherein said electrode unit includes:
an electrode body part made of a dielectric;
said first electrode and said second electrode located within said electrode body part, and each having conductivity;
a gas inlet located in said electrode body part, and receiving said source gas externally supplied; and
a gas internal flow path located within said electrode body part, and allowing said source gas having entered through said gas inlet to pass therethrough, said gas internal flow path being spiral in plan view,
said first electrode and said second electrode are arranged on sides of opposite side surfaces of said gas internal flow path to oppose each other with a portion of said electrode body part and said gas internal flow path therebetween, and are spiral in plan view along with said gas internal flow path, a region in said gas internal flow path between said first electrode and said second electrode being said discharge space, said dielectric barrier discharge being generated in said discharge space upon application of said AC voltage from said AC power source,
said electrode unit further includes
a plurality of gas ejection ports located below said discharge space to communicate with said gas internal flow path, and
said active gas generated by activating said source gas supplied to said discharge space is jetted through said plurality of gas ejection ports.

2. The active gas generation apparatus according to claim 1, wherein
said first electrode and said second electrode are not exposed from said electrode body part.

3. The active gas generation apparatus according to claim 1, wherein
said second electrode is set to ground level, and said AC voltage is applied to said first electrode, and
said first electrode and said second electrode are arranged so that said second electrode is located on an outermost periphery of said electrode body part in plan view.

4. The active gas generation apparatus according to claim 1, wherein
said electrode body part includes:
an electrode unit base; and
an electrode unit lid located on a front surface of said electrode unit base,
said electrode unit base has a first electrode groove and a second electrode groove each having the same formation depth from said front surface,
said gas internal flow path is groove-shaped to have a predetermined formation depth from said front surface of said electrode unit base,
said first electrode and said second electrode are respectively embedded in said first electrode groove and said second electrode groove, and
said first electrode has a formation height set to be lower than a formation height of said second electrode.

5. The active gas generation apparatus according to claim 1, wherein
an external region which is located immediately below said plurality of gas ejection ports, and to which said active gas is jetted through said plurality of gas ejection ports is defined as an apparatus downstream region, and
said plurality of gas ejection ports each has relatively small dimensions so that pressure in said gas internal flow path is higher than pressure in said apparatus downstream region.

6. The active gas generation apparatus according to claim 5, wherein
said plurality of gas ejection ports are discretely arranged to be spiral in plan view.

7. The active gas generation apparatus according to claim 1, further comprising
a cooling fin made of a dielectric, and sealed to said electrode unit.

8. The active gas generation apparatus according to claim 1, wherein
a constituent material of said electrode body part is at least one of alumina, quartz, silicon nitride, aluminum nitride, and boron nitride.

9. The active gas generation apparatus according to claim 1, wherein
said source gas is gas containing at least one of nitrogen, oxygen, fluorine, and hydrogen.

10. A deposition processing apparatus comprising:
said active gas generation apparatus according to claim 6; and
a deposition processing chamber located in a region including said apparatus downstream region, and having a deposition processing space to directly receive said active gas from said plurality of gas ejection ports.

11. The deposition processing apparatus according to claim 10, wherein
said pressure in said gas internal flow path is set to 10 kPa to atmospheric pressure, and
pressure in said deposition processing space is set to less than said pressure in said gas internal flow path.

* * * * *